(12) United States Patent
Miao (10) Patent No.: US 7,876,146 B2
(45) Date of Patent: Jan. 25, 2011

(54) METHOD AND APPARATUS FOR POWERING DOWN ANALOG INTEGRATED CIRCUITS

(75) Inventor: Guoqing Miao, San Diego, CA (US)

(73) Assignee: QUALCOMM, Incorporated, San Diego, CA (US)

(*) Notice: Subject to any disclaimer, the term of this patent is extended or adjusted under 35 U.S.C. 154(b) by 0 days.

(21) Appl. No.: 11/745,778

(22) Filed: May 8, 2007

(65) Prior Publication Data
US 2008/0278226 A1 Nov. 13, 2008

(51) Int. Cl.
G05F 1/10 (2006.01)
(52) U.S. Cl. ..................... 327/534; 327/563
(58) Field of Classification Search .......... 327/534, 327/561, 562, 563
See application file for complete search history.

(56) References Cited

U.S. PATENT DOCUMENTS 6,525,607 B1 2/2003 Liu
6,888,410 B1 5/2005 Li
7,019,578 B2 3/2006 Koto
7,119,616 B2 * 10/2006 Benzer .................. 530/252

OTHER PUBLICATIONS

International Search Report-PCT/US2008/063071, International Searching Authority-European Patent Office-Sep. 3, 2008.
Written Opinion-PCT/US2008/063071, International Searching Authority-European Patent Office-Sep. 3, 2008.

* cited by examiner

Primary Examiner—Jeffrey S Zweizig
(74) Attorney, Agent, or Firm—William M. Hooks (57) ABSTRACT

A method and an apparatus powers down an analog integrated circuit. A power down circuit is electrically coupled to the analog circuit and is adapted to power down the analog circuit in response to receiving a power down signal. A node protection circuit is electrically coupled to the analog circuit and is adapted to provide a predetermined voltage potential to at least one predetermined node in the analog circuit in response to receiving the power down signal when a voltage potential at the at least one predetermined node is not determined by the power down circuit.

19 Claims, 7 Drawing Sheets

600
Integrated Circuit including an Analog Circuit having A Power Down Circuit with a Dual Power Supply Voltage (VddH and VddL) and a Protection Circuit for Analog Circuit Nodes

FIG. 1

100
CMOS Transistors

Prior Art

NMOS

PMOS

FIG. 2

200
Analog Circuit having A Power Down Circuit
with a Single Power Supply Voltage (VddH)

Prior Art

300
Analog Circuit having A Power Down Circuit
with a Dual Power Supply Voltage (VddH and VddL)

FIG. 3

Prior Art

FIG. 4

400
Analog Circuit having A Power Down Circuit
with a Dual Power Supply Voltage (VddH and VddL)
and a Voltage Level Shifter Prior Art

600
Integrated Circuit including an Analog Circuit having A
Power Down Circuit with a Dual Power Supply Voltage
(VddH and VddL) and a Protection Circuit for Analog Circuit Nodes

METHOD AND APPARATUS FOR POWERING DOWN ANALOG INTEGRATED CIRCUITS

FIELD OF THE INVENTION

The present invention generally relates to integrated circuits (ICs) having both digital and analog circuits to form a system on a chip (SOC). More particularly, the present invention relates to a method and apparatus for powering down an analog circuit in system on a chip having a dual power supply voltage (VddH and VddL), having a protection circuit for analog circuit nodes, and being manufactured using a single-gate oxide process.

BACKGROUND OF THE INVENTION

Integrated Circuit

An integrated circuit (also known as IC, microcircuit, microchip, silicon chip, or chip) is a miniaturized electronic circuit that is manufactured in the surface of a thin substrate of semiconductor material. The electronic circuit may contain active devices, such as transistors that provide electrical gain, and passive devices, such as resistors, capacitors, and diodes.

Field-Effect Transistor

One type of transistor, known as a field-effect transistor (FET), relies on an electric field provided by a gate contact to control the shape and hence the conductivity of a channel in the semiconductor material between a source contact and a drain contact.

A metal-oxide-semiconductor field-effect transistor (MOSFET) is a common field-effect transistor in both digital and analog circuits. The metal-oxide-semiconductor phrase references the physical structure of early and the latest field-effect transistors, wherein a metal gate electrode is placed on top of an oxide insulator, which in turn is placed on top of a semiconductor material. The MOSFET has a channel of n-type or p-type semiconductor material, and is accordingly called a nMOSFET or a pMOSFET.

A primary characteristic for the gate material of a MOSFET is that it is a good conductor. Examples of gate materials include highly-doped polycrystalline silicon ("polysilicon"), metal (e.g., tantalum, tungsten, tantalum nitride, and titanium nitride), and a blended material of polysilicon and metal called silicide, each having associated advantages and disadvantages. Polysilicon gates are not metal have been used for the past twenty years. Therefore, the term 'metal' in the phrase "MOSFET" is often incorrect as process technologies may vary. Metal gates were used for early MOSFETs and are again now being used for fabricating semiconductors at 65 nm and smaller processes.

Figure 1:
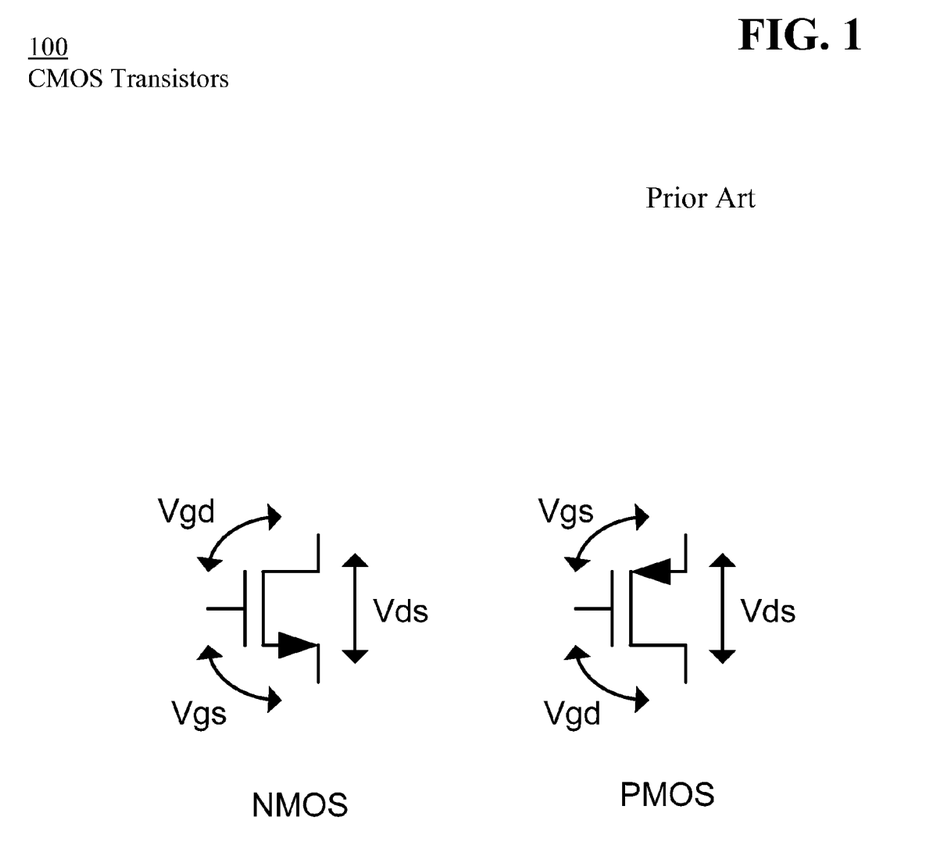
FIG. 1 illustrates a schematic diagram of an nMOSFET and a pMOSFET, according to the prior art.

FIG. 1 illustrates schematic diagrams of an nMOSFET and a pMOSFET. Three reliability issues associated with MOSFETS include time dependent dielectric breakdown (TDDB), hot carrier injection (HCI), and bias temperature instability (BTI).

TDDB occurs when a MOSFET's gate to terminal voltage (either Vgs or Vgd) exceeds a limit permitted by the manufacturing process causing the gate-oxide to deteriorate with time and eventually break down.

HCI occurs in semiconductors when either an electron or a "hole" gains sufficient kinetic energy to overcome a potential barrier, becoming a "hot carrier" and then migrates to a different area of the device. HCI usually occurs when a MOSFET is turned on and its drain-source voltage (Vds) exceeds a limit permitted by the manufacturing process causing an electrical charge in the drain-source channel to have enough energy to be injected into the gate dielectric, thereby causing the threshold voltage to shift and may eventually damage the gate.

Negative BTI (NBTI) only affects pMOSFETs, and positive BTI (PBTI) only affects nMOSFETs. A positive charge builds up at the channel interface of pMOSFETs under negative bias and high temperature conditions (positive bias for nMOSFETs). This increases a threshold voltage and decreases IDsat over time causing device instability and performance degradation.

Although designing longer channel lengths can minimize the HCI effect, the semiconductor manufacturing process controls the TDDB and NBTI effects, and design guidelines must be followed to ensure device reliability.

Perhaps the most stressed condition for MOSFETs happens when powering down the MOSFETs. In a power down mode, the gate terminal may be connected to ground for nMOSFETs or to a positive power supply voltage for pMOSFETs, while the other terminals (e.g., drain or source) may be forced in other directions to undesirable voltage levels. This condition is especially true when a circuit uses a power supply voltage above the semiconductor process limit.

Analog and Digital Circuits

An integrated circuit may contain analog and/or digital electronic circuits, and may combine analog and digital MOSFET circuitry on the same semiconductor for higher integration. Combined analog and digital MOSFET circuitry may be referred to as a "system on a chip" (SOC), and has found wide applications in wireless communications, mobile computing, computers, and consumer electronics. Analog electronic circuits use an analog signals that are continuously variable signals. Digital electronic circuits use digital signals that have either low or high voltage levels, representing a logic "0" and a logic "1," respectively.

The growth of digital circuits like the microprocessor has provided the motivation to advance MOSFET technology faster than any other type of silicon-based transistor.

A principal reason for the success of the MOSFET was the development of digital complementary metal-oxide-semiconductor (CMOS) logic, which uses p- and n-channel MOSFETs as building blocks. CMOS logic is continuously being scaled down to achieve low-cost, high density, low power, and high-speed digital systems. In CMOS logic, a collection of nMOSFETs is arranged in a pull-down network between the output and the lower-voltage power supply rail (often named $V_{ss}$ or quite often ground). Instead of the load resistor of nMOS logic gates, CMOS logic gates have a collection of nMOSFETs in a pull-up network between the output and the higher-voltage rail (often named $V_{dd}$). Now pull-up and pull-down refer to the idea that the output node, which happens to be where the pull-up and pull-down networks intersect, exhibit some internal capacitance that is charged or discharged respectively through pathways formed by the p/nMOS networks for various inputs. This capacitance is charged when there is a direct path from Vdd to the output, and discharged when there is a direct path from output to ground. A digital CMOS circuit ideally may not be in a pull-up and pull-down phase at the same time, or else both the p/n-networks will fight to keep the voltage on the capacitance either Vdd or ground. The p-type transistor network is complementary to the n-type transistor network, so that when the n-type is off, the p-type is on, and vice-versa.

MOSFETs are widely used for analog circuits as well. Some of the advantages of MOSFETs are that due to their positive temperature coefficient, they do not suffer as much from thermal runaway as bipolar junction transistors (BJTs) do and that their linear region allows them to be used as precision resistors, which can have a much higher controlled resistance than BJTs. They also can be formed into capacitors and specialized circuits that allow op-amps made from them to appear as inductors, thereby permitting all of the normal analog devices, except for diodes (which can be made smaller than a MOSFET anyway), to be built entirely out of MOSFETs. This allows for complete analog circuits to be made on a silicon chip in a much smaller space.

Engineering Tradeoffs

Although digital circuits can directly benefit from scaling down the size of the devices, it is not always true for analog circuits. When the sizes of the devices are scaled down for a digital circuit, the digital circuit's power supply voltage is also lowered to reduce power supply requirements and to insure reliability of the devices. However, lowering the power supply voltage for an analog circuit limits the dynamic range of the analog circuit, which reduces the performance of the analog circuit. Raising the power supply voltage for an analog circuit improves the dynamic range of the analog circuit to maintain the performance of the analog circuit, but causes the analog circuit to consume more power, and may threaten the reliability of analog circuit, especially in the power down mode.

Prior Solutions

One solution to overcome the disadvantages of scaling down the size of devices in an analog circuit in a SOC is to manufacture an integrated circuit using a dual-gate oxide process for devices in the digital and analog circuits. In a dual-gate oxide process, the digital circuit uses thin-gate oxide devices to permit a lower power supply voltage to be used, and the analog circuit uses thick-gate oxide devices to permit a higher power supply voltage to be used and to provide higher reliability devices. A disadvantage of this solution is that manufacturing an integrated circuit with a dual-gate oxide process costs more than manufacturing one with a single-oxide gate process because additional masks, processing steps, and time are needed to manufacture the thick-gate oxide for the analog devices. Alternatively, if the thick-gate oxide process were applied to the digital and analog circuits, then a single thick-gate oxide process would be used for the entire integrated circuit at a cost to the integrated circuit of the thick-gate oxide process over the thin-gate process. In both cases, the extra cost may be not acceptable in low cost SOC designs, especially in the case when a majority of the circuits in a SOC are digital and a minority of the circuits are analog.

Figure 2:
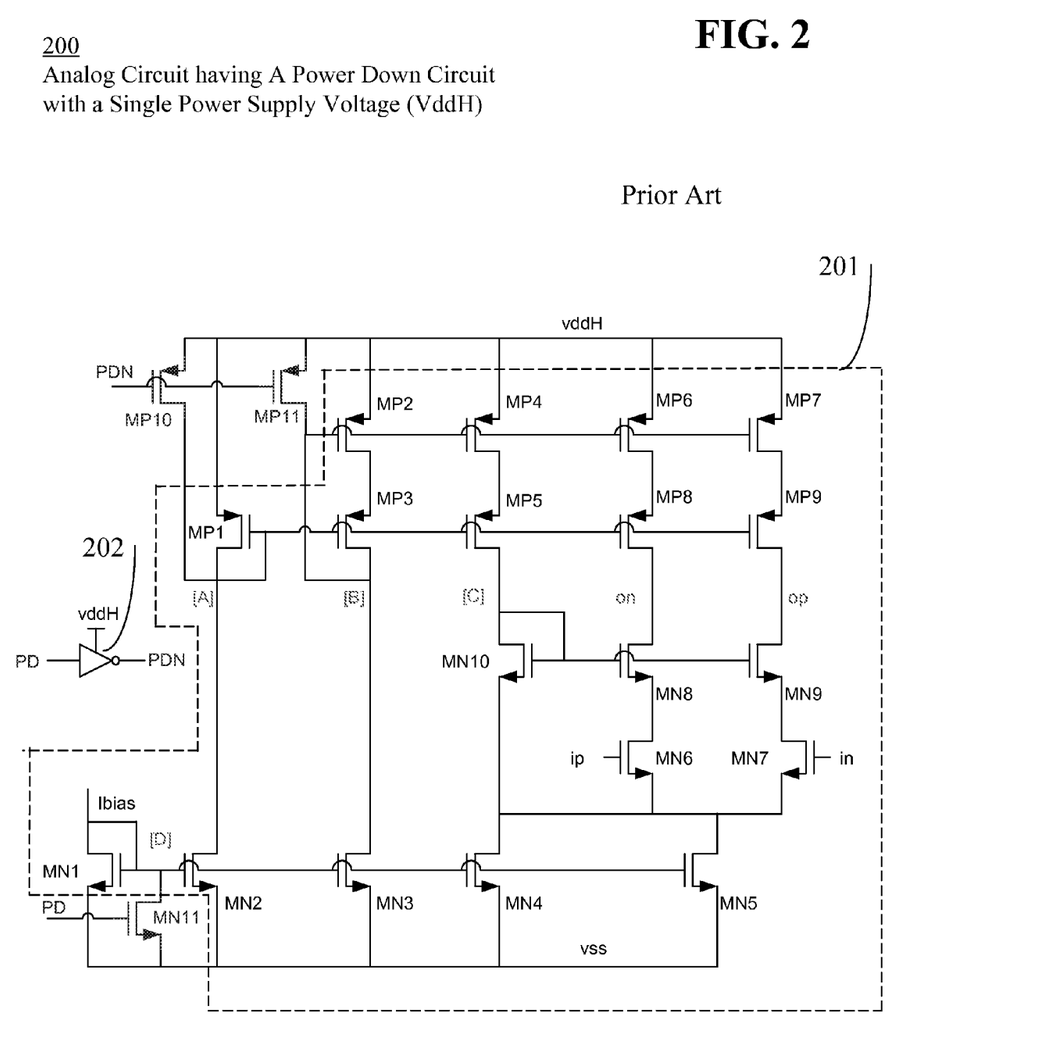
FIG. 2 illustrates an integrated circuit having a power down circuit with a single power supply voltage (VddH), according to the prior art.

Another solution to overcome the disadvantages of scaling down the size of devices in an analog circuit in a SOC is to use a power down circuit with a single power supply voltage (VddH), as shown in FIG. 2. The analog circuit, represented as a conventional operational transconductance amplifier (OTA) 102, for example, and the digital circuit, represented as an inverter 202, for example, both use the same single power supply voltage (VddH), as shown in FIG. 2. The single power supply voltage (VddH) operates within the reliability requirements of the OTA 201 and the inverter 202.

Figure 3:
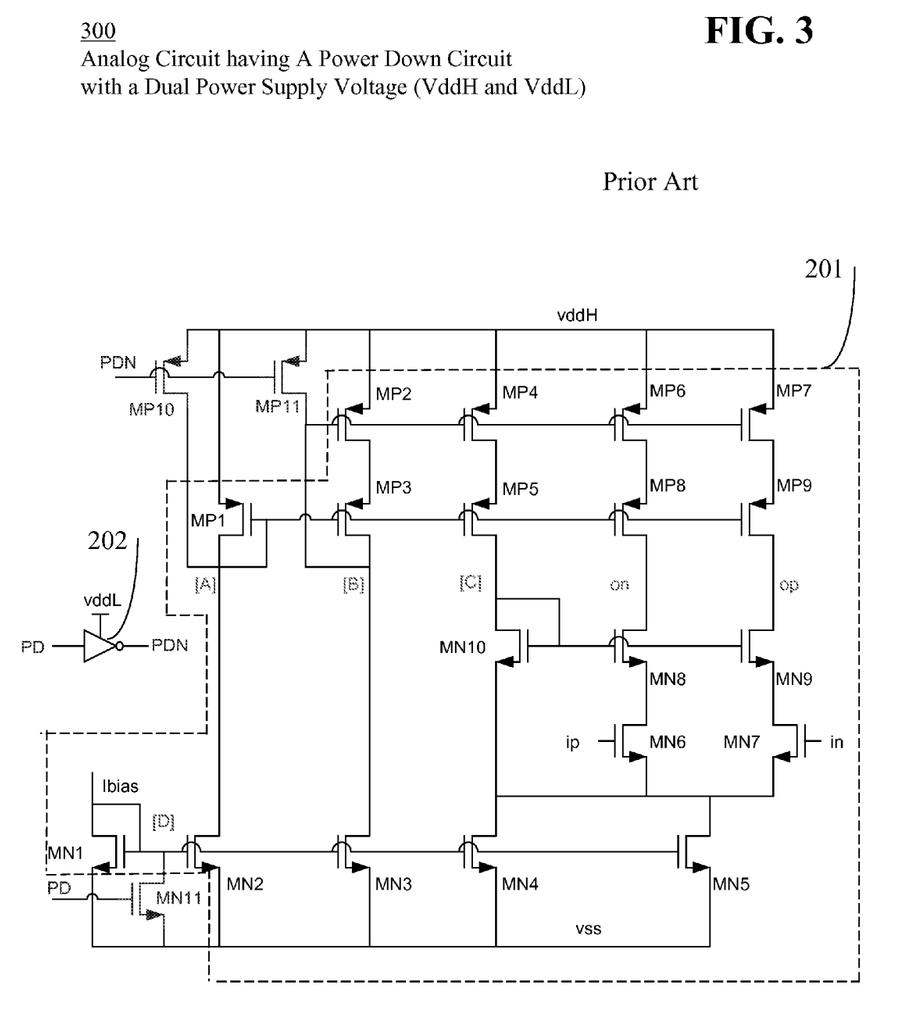
FIG. 3 illustrates an integrated circuit having a power down circuit with a dual power supply voltage (VddH and VddL), according to the prior art.
Figure 4:
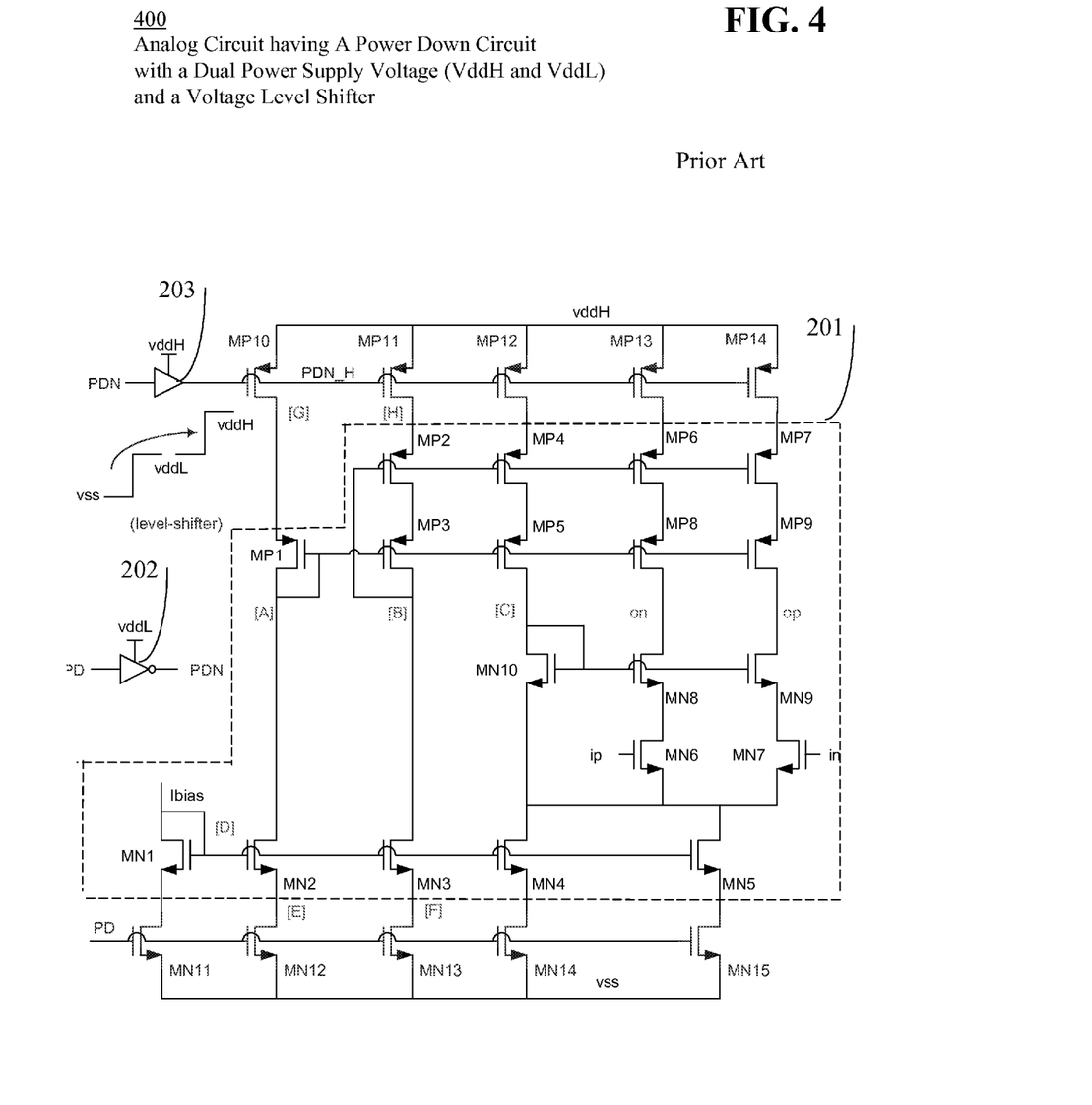
FIG. 4 illustrates integrated circuit having a power down circuit with a dual power supply voltage (VddH and VddL) and a voltage level shifter, according to the prior art.
Figure 6:
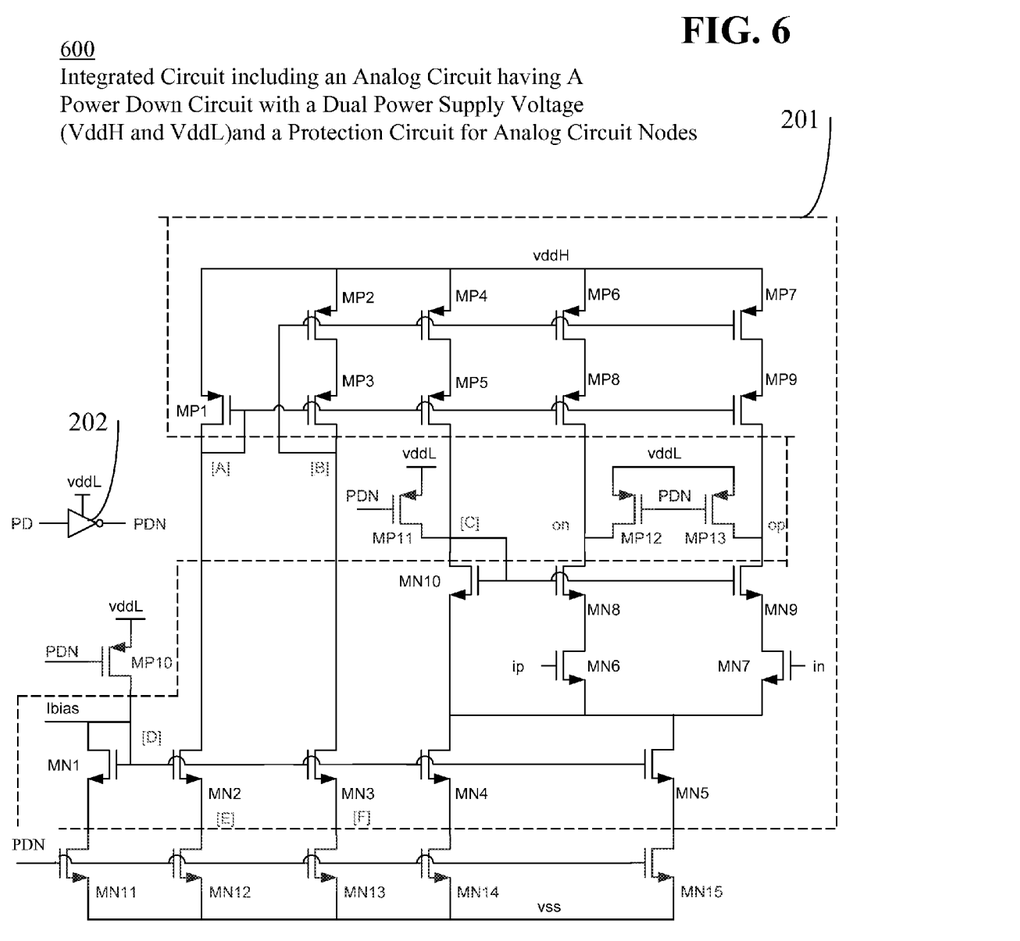
FIG. 6 illustrates the integrated circuit, as shown in FIG. 5, having an analog circuit having a power down circuit with a dual power supply voltage (VddH and VddL) and a protection circuit for analog circuit nodes, according to one aspect of the present invention.

The analog circuit, represented as the OTA 201 shown in FIG. 2, as well as FIGS. 3, 4, and 6 is conventional. The OTA 201 includes pMOSFETs, MP1-9, and nMOSFETs, MN1-10. Source terminals of MP2, 4, 6, and 7 are electrically coupled to a high voltage potential, VddH (e.g., 2.1V minimum, 2.2V nominal, 2.3V maximum). Source terminals of MN2, 3, 4, and 5 are electrically coupled to a ground voltage potential, Vss (e.g., 0V). The inputs terminals for the OTA 201 are the gate terminals of MN6 and MN7 illustrated as "in" and "ip," respectively. The output terminals for the OTA 201 are the drain terminals of MN8 and MN9 illustrated as "on" and "op," respectively. The bias terminal for the OTA 201 is the drain terminal of MN1, which is also electrically coupled to the gate terminal of MN1.

The digital circuit, represented as the inverter 202 shown in FIG. 2, as well as in FIGS. 3, 4, and 6, is also conventional. The inverter 202 is adapted to receive a power down signal, PD, and adapted to invert the power down signal, PD, to an inverted power down signal, PDN. When the PD signal is logic 1 or a high voltage, such as a high voltage potential, VddH, the inverted power down signal, PDN, is logic 0 or a low voltage, such as a ground potential, Vss. When the PD signal is logic 0, or a low voltage, such as a ground potential, Vss, the inverted power down signal, PDN, is logic 1 or a high voltage, such as a high voltage potential, VddH.

The OTA 201 powers down when the inverter 202 receives the power down signal, PD, as logic 1 or a high voltage. The OTA 201 does not power down and operates in a normal state when the inverter 202 receives the power down signal, PD, as logic 0 or a low voltage.

To power down the OTA 201, the power down signal, PD, representing logic 1 or a high voltage, is provided to the inverter 202 to generate the inverted power down signal, PDN, representing logic 0 or a low voltage. The power down signal, PD, representing logic 1 or a high voltage, is applied to the gate terminal of MN11. The inverted power down signal, PDN, representing logic 0 or a low voltage, is applied to the gate terminal of MP10 and MP11. After power down, no current flows between the high voltage supply, VddH, and the ground voltage, Vss.

A logic 0 or a low voltage applied to the gate terminal of MP10 removes a logic 1 or high voltage, VddH, from the drain terminal of MP10, as well as the gate terminals of MP1, MP3, MP5, MP8, and MP9, to turn off MP1, MP3, MP5, MP8, and MP9, respectively. A logic 0 or a low voltage applied to the gate terminal of MP11 removes a logic 1 or high voltage, VddH, from the drain terminal of MP11, as well as the gate terminals of MP2, MP4, MP6, and MP7, to turn off MP2, MP4, MP6, and MP7, respectively. A logic 1 or high voltage, VddH, applied to the gate terminal of MP11 provides a logic 0 or low voltage, Vss, at the drain terminal of MP11, as well as the gate terminals of MN2, MN3, MN4, and MN5, to turn off MN2, MN3, MN4, and MN5, respectively.

One disadvantage of the integrated circuit, shown in FIG. 2, is the additional associated with the dual-gate oxide and single-gate oxide processes, while maintaining reliability and dynamic range for the analog circuit, as explained above.

Yet another solution to overcome the disadvantages of scaling down the size of devices in an analog circuit in a SOC is to use the same power down circuit, as shown in FIG. 2, with a dual power supply design (VddH and VddL), as shown in FIG. 3. A low voltage supply, VddL (e.g., 1.2V minimum, 1.25V nominal, 1.3V maximum), represents the lowest voltage that may be used with the thin-gate oxide process while maintaining acceptable device reliability. FIG. 3 assumes that the a single thin-gate oxide process is used for both the digital and analog circuits to reduce cost, and the high voltage supply, VddH, is used to maintain an acceptable dynamic range for the analog circuit at the risk of exceeding the device reliability limits.

The integrated circuit, shown in FIG. 3, has several disadvantages. First, the gate terminals of MP10 and MP11 may not be pulled low to ground in the normal operation mode, as permitted in FIG. 2, because their Vgs voltage will be as high as VddH, which exceeds the low voltage supply, VddL, limit of the thin-gate oxide process. Second, in the power down mode, nodes A and B are forced to the high voltage supply, VddH, and node D is forced to the ground potential, Vss, by MN11, which causes reliability problems across the gate-drain terminals, Vgs, of MN2 and MN3. Third, when both the top (MP2-9) and bottom (MN1-5) bias devices are turned off, node C and the OTA 201 outputs "op" and "on" are floating and may be stuck at a voltage close to the high voltage supply, VddH, which causes reliability problems for MN8-10, and any other circuit connected to the outputs "op" and "on." For these reasons, the traditional power down scheme, shown in FIG. 2, may not be used in the dual power supply design, shown in FIG. 3.

Still another solution to overcome the disadvantages of scaling down the size of devices in an analog circuit in a integrated circuit is to use a power down circuit with a dual power supply design and a voltage shifter 203, as shown in FIG. 4. To solve the reliability issues related to MP10 and MP11 in the power down mode, a voltage level shifter 203 shifts the inverted powder down signal, PDN, to a higher voltage level instead of the ground potential, Vss. To meet the reliability requirement, the low level voltage of the inverted power down signal, PDN, is shifted to a voltage level of VddH-VddL (e.g., 2.2V−1.25V=0.95V) so the gate-source voltage for MP10 and MP1 in the power down mode is the low voltage, VddL, which is within the reliability limit of the semiconductor manufacturing process. During the normal operation mode, the inverted power down signal, PDN, should be the low voltage, VddL. Therefore, in FIG. 4, the voltage level shifter 203 is needed to shift a voltage of the inverted power down signal, PDN, from Vss (LOW)/NVddL (HIGH) to VddL(LOW)/VddH(HIGH), which is not trivial to design, and may need its own power down control circuit. The power down devices MN11-MN15 are connected in series with the nMOS bias devices, MN1, MN2, MN 4, MN 6, and MN 7, respectively. The power down devices MP10~MP14 are connected in series with the pMOS bias devices, MP1-5, respectively. In FIG. 4, in the power down mode, nodes A and B will not be forced to VddH, shown in FIG. 3.

The integrated circuit, shown in FIG. 4, has several disadvantages. First, the voltage level shifter 203 is needed to generate the inverted power down signal, PDN, which consumes power and is not trivial to design, especially in the conditions when VddH is below 2 VddL. Second, nodes A, B, C, D, E, F, "on," "op," and other internal nodes are floating in the power down mode, which may cause reliability problems. The reason behind this is that while MN11-15 devices are shut down immediately after the power down signal, PD, goes low. The top pMOS power down signal is always delayed relative to the bottom nMOS power down signal, because PDN and PDN_H have to go through the inverter 202 and the level shifter 203, rather than just the inverter 202. Therefore, after the bottom nMOS devices, MN1-15, are turned off, but before the top power down signal is triggered, all the internal node voltages are forced to VddH, which may cause reliability problems to the bottom NMOS devices, MN2-5. Even if the top and bottom power down signals match perfectly in time (i.e., triggered at the exact time), which is not trivial to implement because the internal nodes are floating, the internal nodes may still drift to either ground or VddH because of the leakage current mismatches between nMOS path and pMOS path.

Accordingly, there is a need for a method and apparatus for powering down an analog circuit in system on a chip having dual power supply voltages (e.g., VddH and VddL) and manufactured using a single thin-gate oxide process. Further, the method and apparatus should not use a voltage level shifter and should not have floating voltages at the internal analog circuit nodes. Further, the method and apparatus should operate within device reliability limits and be designed and manufactured with minimal cost.

SUMMARY OF THE INVENTION

The present invention includes a method, an apparatus, and/or a system. The apparatus may include data processing systems, which perform the method, and computer readable media storing executable applications which, when executed on the data processing systems, cause the data processing systems to perform the method.

According to one aspect of the present invention, a method and an apparatus powers down an analog integrated circuit. A power down circuit is electrically coupled to the analog circuit and is adapted to power down the analog circuit in response to receiving a power down signal. A node protection circuit is electrically coupled to the analog circuit and is adapted to provide a predetermined voltage potential to at least one predetermined node in the analog circuit in response to receiving the power down signal when a voltage potential at the at least one predetermined node is not determined by the power down circuit.

According to other aspects of the present invention, the present invention employs the method, the apparatus, as well as, a computer readable memory, an integrated circuit, and a system on a chip.

These and other aspects of the present invention will be apparent from the accompanying drawings and from the following detailed description.

BRIEF DESCRIPTION OF THE DRAWINGS

Aspects of the present invention are illustrated by way of examples and not limitation in the figures of the accompanying drawings, in which like reference numbers designate corresponding elements.

DETAILED DESCRIPTION OF THE EMBODIMENTS

The following description and drawings are illustrative of the invention and are not to be construed as limiting the invention. Numerous specific details are described to provide a thorough understanding of the present invention. However, in certain instances, well-known or conventional details are not described in order to avoid obscuring the description of the present invention. References to one embodiment or an embodiment in the present disclosure are not necessarily to the same embodiment, and such references include one or more embodiments.

Figure 5:
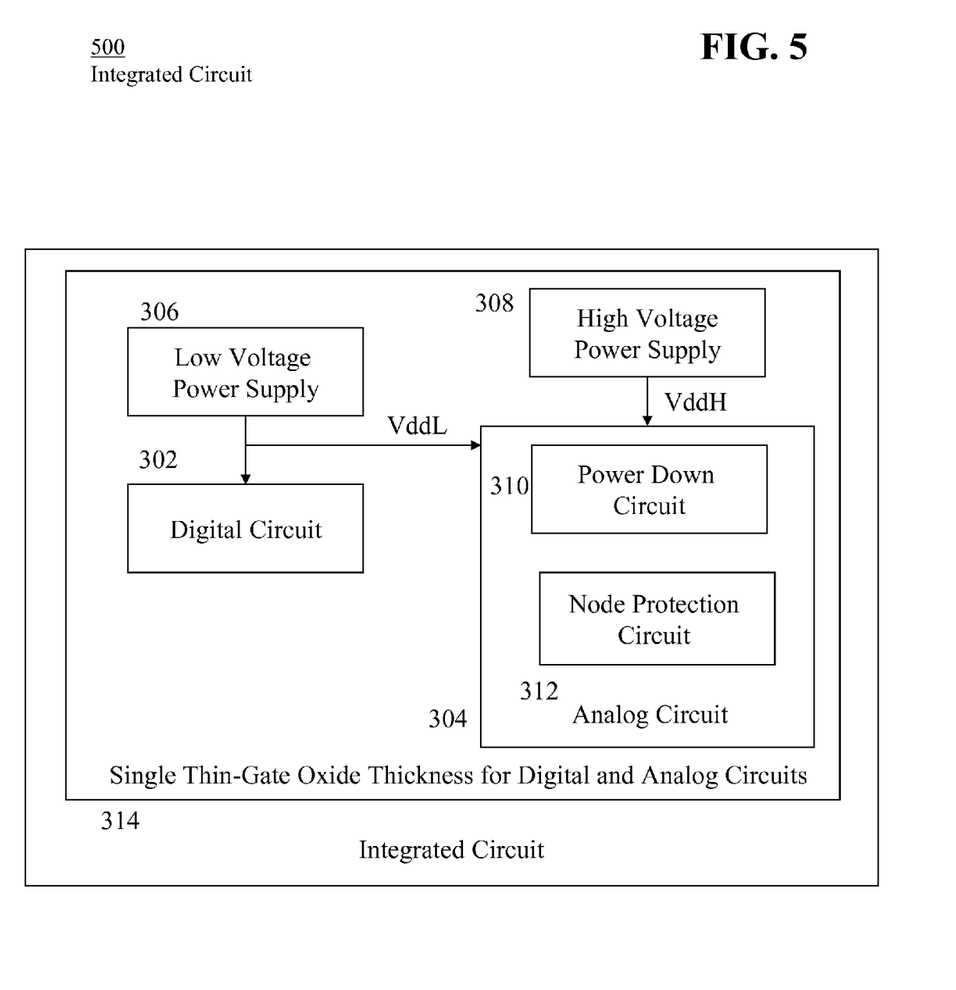
FIG. 5 illustrates a block diagram of an integrated circuit, according to one aspect of the present invention.

FIG. 5 illustrates a block diagram of an integrated circuit (IC) 500, according to one aspect of the present invention. The IC 500 includes a digital circuit 302, an analog circuit 304, a low voltage power supply 306, and a high voltage power supply 308. The analog circuit 304 further includes a power down circuit 310 and a node protection circuit 312. The IC 500 employs a single thin-gate oxide thickness for devices in both the digital and the analog circuits, as described in the Background Section.

The digital circuit 302 and the analog circuit 304 are as described in the Background Section. The low voltage power supply 306 provides a low voltage, VddL, as described in the Background Section. The high voltage power supply 308 provides a high voltage, VddH, as described in the Background Section. The low voltage power supply 306 provides a low voltage, VddL that a single device can sustain, given the semiconductor manufacturing process, without reliability issues. To guarantee the device reliability, the voltage difference between the three main terminals of a pMOS or pMOS device should not exceed the limit of the semiconductor manufacturing process. Otherwise, permanent damage may happen to the gate-oxide of the device or the channel within the device. The high voltage power supply 308 provides a high voltage, VddH, chosen for the analog circuit 304, which may be twice as high, for example, as the limit of the semiconductor manufacturing process. However, other multiples or fractions of the limit of the semiconductor manufacturing process may be used to determine the high voltage, VddH. The power down circuit 310 provides a method and apparatus for powering down the analog circuit 312 in system on the IC 500 having dual power supply voltages (e.g., VddH and VddL) and manufactured using a single thin-gate oxide process 314. Further, the method and apparatus does not use a voltage level shifter, like that shown in FIG. 4. Further, the node protection circuit 312 does not permit floating voltages at the internal analog circuit nodes when the analog circuit 304 uses a high power supply voltage, VddH; especially in the power down mode when the devices are under the highest stress. Further, the method and apparatus permits operation within device reliability limits and is designed and manufactured for minimal cost.

FIG. 6 illustrates the IC 500, as shown in FIG. 5, having an analog circuit 304 having a power down circuit with a dual power supply voltage (VddH and VddL) and a node protection circuit. FIG. 6 illustrates an efficient and an effective power down technique, which guarantees the reliability of the devices in the analog circuit 304.

The voltage level shifter 203 and MP10-14, as shown in FIG. 4, are eliminated in FIG. 6. No level shifter is needed for power down signals because the power down circuit 310 is employed only in the nMOS side using MN11-15 and MP10, as shown in FIG. 6.

Further, MP10 and MP11, as shown in FIGS. 2 and 3, are also eliminated in FIG. 6. In FIG. 6, no power down circuitry is employed on the pMOS side having MP1-MP9 of the analog circuit 304.

The analog circuit 304, represented as the OTA 201 shown in FIG. 6, as well as represented as OTA 201 in FIGS. 2, 3, and 4, is conventional. Any type of analog circuit 304 may employ aspects of the present invention. Other types of analog circuits include, without limitation, different OTA designs, a reference bias circuit, power amplifiers, filters, analog to digital converters, and digital to analog converters.

The OTA 201 includes pMOSFETs, MP1-9, and nMOSFETs, MN1-10. Source terminals of bias devices MP2, MP4, MP6, and MP7 are electrically coupled to a high voltage potential, VddH (e.g., 2.1V minimum, 2.2V nominal, 2.3V maximum). Source terminals of bias devices MN1, MN2, MN3, MN4, and MN5 are electrically coupled to a ground voltage potential, Vss (e.g., 0V), via power down circuitry, MN11, MN12, MN13, MN14, and MN15, respectively. The inputs terminals for the OTA 201 are the gate terminals of MN6 and MN7 illustrated as "in" and "ip," respectively. The output terminals for the OTA 201 are the drain terminals of MN8 and MN9 illustrated as "on" and "op," respectively. The bias terminal for the OTA 201 is the drain terminal of MN1, which is also electrically coupled to the gate terminal of MN1.

The digital circuit 302, represented as the inverter 202 shown in FIG. 6, as well as in FIGS. 2, 3, and 4, is also conventional. The inverter 202 is adapted to receive a power down signal, PD, and adapted to invert the power down signal, PD, to an inverted power down signal, PDN. The inverter 202 is electrically coupled to a low voltage potential, VddL, and a ground potential voltage, Vss, wherein VddL is greater than Vss. When the PD signal is logic 1 or a high voltage, such as low voltage potential, VddL, the inverted power down signal, PDN, is logic 0 or a low voltage, such as a ground potential, Vss. When the PD signal is logic 0, or a low voltage, such as a ground potential, Vss, the inverted power down signal, PDN, is logic 1 or a high voltage, such as a low voltage potential, VddL.

The OTA 201 powers down when the inverter 202 receives the power down signal, PD, as logic 1 or a high voltage. The OTA 201 does not power down and operates in a normal mode when the inverter 202 receives the power down signal, PD, as logic 0 or a low voltage.

To power down the OTA 201, the power down signal, PD, representing logic 1 or a high voltage, is provided to the inverter 202 to generate the inverted power down signal, PDN, representing logic 0 or a low voltage. The inverted power down signal, PDN, representing logic 0 or a low voltage, is applied to the gate terminals of MN11-15. After power down, no current flows between the high voltage supply, VddH, and the ground voltage, Vss, thereby turning off the OTA 201. More particularly, logic 0 or a low voltage applied to the gate terminals of MN11-15 removes logic 0 or ground voltage, Vss, from the drain terminal of MN11-15, to stop the current flow through MN1-5, respectively.

During the normal operation mode, power down circuitry MN11-MN15 are all turned ON and MP10-MP13 are OFF, permitting current flow between the high voltage supply, VddH, and the ground voltage, Vss, thereby turning on the OTA 201.

To protect other nMOS devices during the power down mode, the node protection circuit 312, represented by MP10-MP13, is added to the IC 600. During the power down mode, the node protection circuit 312, represented by MP10-MP13, forces the internal nodes C, D, OP, ON to the low voltage power supply level, VddL. This helps to protect all the NMOS devices and any other circuit connected to OP and ON where this OTA 201 is used. During the power down mode, the voltages as nodes A and B drift to the high voltage power supply level, VddH, in the power down mode, which effectively shuts down all the top PMOS bias devices, MP1-MP9. During the power down mode, a logic 0 or low voltage, Vss, applied to the gate terminal of MP10, which causes the low voltage power supply, VddL, to be provided to the gate terminals of MN1-5. The drain-gate voltage, Vdg, for each of MN2 and MN3 is VddH-VddL and are below the reliability limits. Node E and F are forced to one threshold voltage below VddL, so it automatically protects all the power down devices in the OTA 201 that are at risk.

The node protection circuit 312 may be designed and located to protect any nodes that the IC designer determines that may be have a reliability risk. Typically, nodes that are a reliability risk are those nodes that are "internal" a particular circuit because such internal nodes are likely to float to an undetermined voltage, and are not pulled to a known voltage, such as VddH or Vss. Therefore, the location and number of nodes that require the node protection circuit 312 varies with a particular design of a particular analog circuit 304. Compared with the prior known solutions for power down techniques, the method and apparatus for powering down the analog circuit 304 provides the following advantages The power down circuit 310 is efficient and flexible because it uses only the low power supply and controls at only the bottom nMOS devices. No level shifter is needed. All of the power down devices (MN11-MN15, MP10-MP13) can be devices of minimum channel length, the extra silicon cost for the seven power down devices is minimal. As long as VddH is below two times VddL, for example, VddH can vary in a wide range, between VddL to two times VddL.

The power down circuit 310 is reliable because it locks the internal node voltages in the power down mode to VddL, which solves the transient reliability issues as described in FIG. 4, and the long-term node voltage drifting problems, as described in FIGS. 3 and 4.

The IC 500 has been simulated and tested. In the normal operation mode, the circuit consumes around 5 mA from VddH (e.g., 2.1 v), and no current from VddL (e.g., 1.4 v). After the power down control signal is triggered, the current consumed from VddH decreased to 9.59 nA, and the current consumed from VddL decreased to 5.60 nA.

Figure 7:
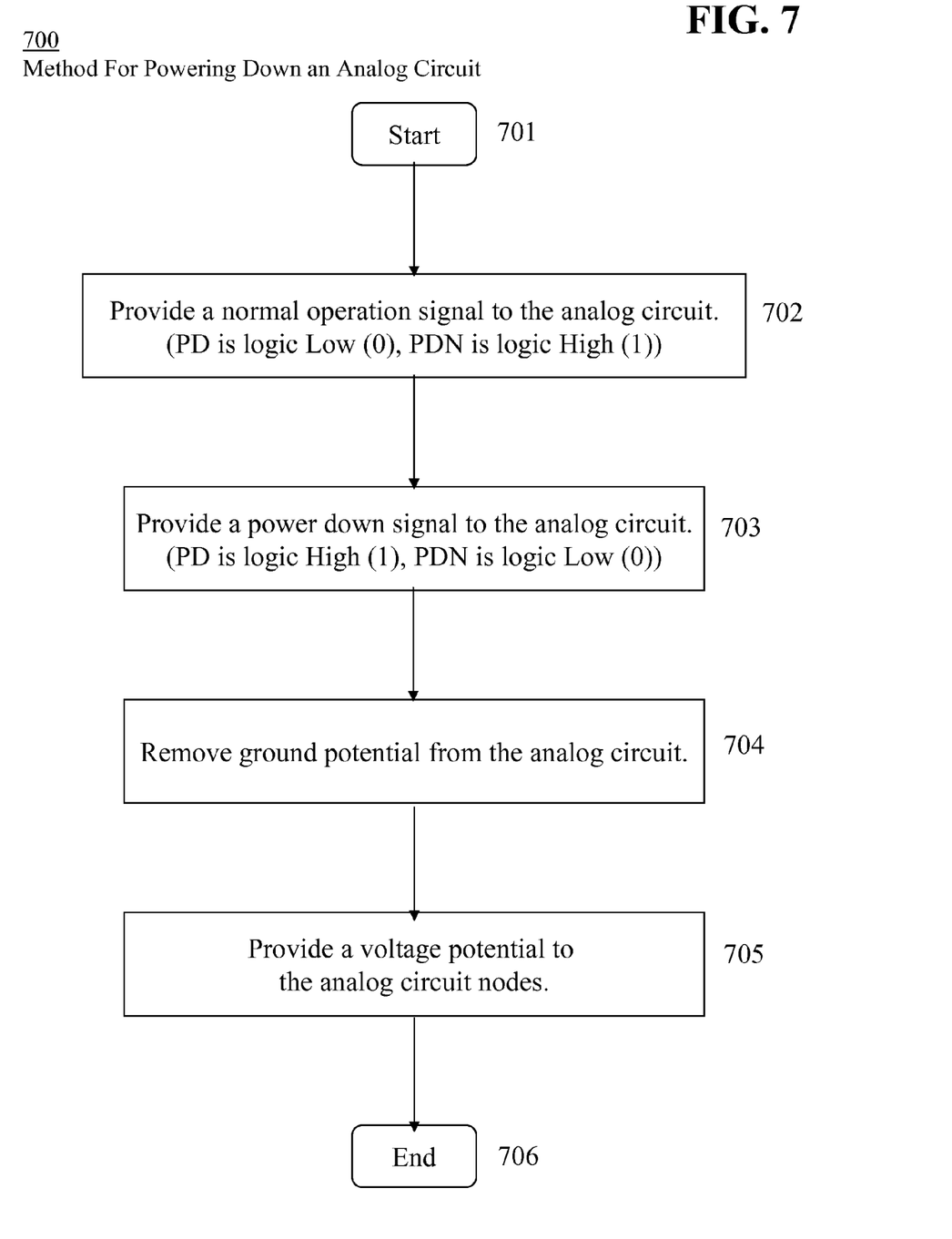
FIG. 7 illustrates a method for powering down the analog circuit, as shown in FIG. 6, according to one aspect of the present invention.

FIG. 7 illustrates a method for powering down the analog circuit 312, as shown in FIG. 6 according to one aspect of the present invention.

At method step 701, the method starts.

At method step 702, provides a normal operation signal to the analog circuit 304. When the inverter 202 receives the power down signal, PD, as logic 0 or a low voltage, the inverted power down signal, PDN, is logic 1 or a high voltage, such as VddL. In this case, the OTA 201 does not power down and operates in a normal mode. During the normal operation mode, the power down circuit 310, MN11-MN15, are all turned ON and node protection circuit 312, MP10-MP13, are OFF, permitting current flow between the high voltage supply, VddH, and the ground voltage, Vss, thereby turning on the OTA 201. The devices MN11-MN15 are all turned ON and the devices MP10-MP13 are turned OFF because the gate terminals for each of these devices receive a logic 1 or high voltage signal, such as VddL.

At method step 703, provides a power down signal to the analog circuit 304. To power down the OTA 201, the power down signal, PD, representing logic 1 or a high voltage, is provided to the inverter 202 to generate the inverted power down signal, PDN, representing logic 0 or a low voltage.

At method step 704, removes the ground potential, Vss, from the analog circuit 304. The inverted power down signal, PDN, representing logic 0 or a low voltage, is applied to the gate terminals of MN11-15 to remove the voltage ground, Vss, from the OTA 201, thereby turning off the OTA 201.

At method step 705, provides a voltage potential to the internal analog circuit nodes. To protect other nMOS devices during the power down mode, the node protection circuit 312, represented by MP10-MP13, is added to the IC 600, as described herein above.

At method step 706, the method ends.

Alternative Implementations

The system, elements, and/or processes contained herein may be implemented in hardware, software, or a combination of both, and may include one or more processors. A processor is a device and/or set of machine-readable instructions for performing task. A processor may be any device, capable of executing a series of instructions embodying a process, including but not limited to a computer, a microprocessor, a controller, an application specific integrated circuit (ASIC), finite state machine, digital signal processor (DSP), or some other mechanism. The processor includes any combination of hardware, firmware, and/or software. The processor acts upon stored and/or received information by computing, manipulating, analyzing, modifying, converting, or transmitting information for use by an executable application or procedure or an information device, and/or by routing the information to an output device.

An executable application comprises machine code or machine readable instruction for implementing predetermined functions including, for example, those of an operating system, a software application program, or other information processing system, for example, in response user command or input.

An executable procedure is a segment of code (i.e., machine readable instruction), sub-routine, or other distinct section of code or portion of an executable application for performing one or more particular processes, and may include performing operations on received input parameters (or in response to received input parameters) and providing resulting output parameters.

In various embodiments, hardwired circuitry may be used in combination with software instructions to implement the present invention. Thus, the techniques are not limited to any specific combination of hardware circuitry and software, nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor.

It will be apparent from this description that aspects of the present invention may be embodied, at least in part, in software. That is, the techniques may be carried out in a computer system or other data processing system in response to its processor executing sequences of instructions contained in a machine-readable medium.

A machine-readable medium includes any mechanism that provides (i.e., stores and/or transmits) information in a form accessible by a machine (e.g., a computer, network device, personal digital assistant, computer, data processor, manufacturing tool, any device with a set of one or more processors, etc.). A machine-readable medium can be used to store software and data which, when executed by a data processing system, causes the system to perform various methods of the present invention. Portions of this executable software and/or data may be stored in various places. For example, a machine-readable medium includes recordable/non-recordable media (e.g., read only memory (ROM), random access memory (RAM), magnetic disk storage media, optical storage media, flash memory devices, non-volatile memory, cache, remote storage device, etc.), as well as electrical, optical, acoustical or other forms of propagated signals (e.g., carrier waves, infrared signals, digital signals, etc.), etc. Any type of MOS devices, including nMOS and pMOS devices, such as nMOS-FETs and pMOSFETs, may employ aspects of the present invention respectively. Various integrated circuit designs may interchange the use of nMOS and pMOS devices to achieve the same function and effect. Aspects of the present invention may be employed in any part of a communication system, which may include a global navigation satellite system (GNSS), a cellular system, and/or a landline telephone system. The cellular system may include multiple cellular base stations, a mobile switching center, and/or a location server, which is otherwise called a position determining entity (PDE).

The communication system provides wireless communications for a mobile station, and is not limited to cellular, fixed wireless, PCS, or satellite communications systems. The communication system may provide for multiple access communications, in accordance with any standard or protocol, such as, for example, CDMA, TDMA, FDMA, or GSM, or combinations thereof.

A mobile station may include a GNSS receiver (e.g., a GPS receiver), a mobile station (MS) transmitter, and/or a mobile station receiver. Other elements of the mobile station, include, for example, a GNSS antenna, a cellular antenna, a processor, a user interface, a portable power supply, and a memory device.

The mobile station may also contain a memory device representing any type of data storage device, such as computer memory devices or other tangible or computer-readable storage medium, for example. The memory device represents one or more memory devices, located at one or more locations, and implemented as one or more technologies, depending on the particular implementation of the mobile station. In addition, the memory device may be any device readable by a processor and capable of storing data and/or a series of instructions embodying a process. Examples of the memory device include, but are not limited to, RAM, ROM, EPROM, EEPROM, PROM, disk (hard or floppy), CD-ROM, DVD, flash memory, etc.

The mobile station may contain a processor controlling the operation of the mobile station. Other mobile functions in the processor represent any or all other functions of the mobile station that have not already been described herein. Such other mobile functions include, for example, operating the mobile station to permit the mobile station to make telephone calls and communicate data.

The mobile station may contain a portable power supply, which stores and provides portable electrical energy for the electrical elements of the mobile station. Examples of the portable power supply include, but are not limited to, batteries and fuel cells. The portable power supply may be or may not be rechargeable. The portable power supply typically has a limited amount of stored electrical energy, and needs to be replaced or renewed after some amount of use so that the mobile station can continue to operate.

The mobile station may be fixed (i.e., stationary) and/or mobile (i.e., portable). The mobile station may be implemented in a variety of forms including, but not limited to, one or more of the following: a personal computer (PC), a desktop computer, a laptop computer, a workstation, a minicomputer, a mainframe, a supercomputer, a network-based device, a data processor, a personal digital assistant (PDA), a smart card, a cellular telephone, a pager, and a wristwatch In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An integrated circuit comprising:
    a low voltage power supply adapted to provide a low voltage potential;
    a high voltage power supply adapted to provide a high voltage potential, higher than the low voltage potential;
    a ground voltage power supply adapted to provide a ground voltage potential, lower than the low voltage potential;
    a digital circuit electrically coupled to receive the low voltage potential and the ground voltage potential;
    an analog circuit electrically coupled to receive the high voltage potential and the ground voltage potential;
    a power down circuit electrically coupled to the analog circuit and adapted to power down the analog circuit in response to a power down signal, wherein no portion of the power down circuit is disposed intermediate the high voltage power supply and the analog circuit; and
    a node protection circuit electrically coupled to the analog circuit, wherein each transistor in the node protection circuit is adapted to provide the low voltage potential to at least one node in the analog circuit in response to the power down signal.

2. An integrated circuit, according to claim 1, wherein the digital circuit further comprises an inverter.

3. An integrated circuit, according to claim 1, further comprising:
    an inverter adapted to receive the power down signal and adapted to invert the power down signal to provide the inverted power down signal.

4. An integrated circuit, according to claim 1, wherein the power down circuit further comprises:
    at least one power down transistor.

5. An integrated circuit, according to claim 4, wherein the at least one power down transistor is adapted to control current flow in at least one current path in the analog circuit between the high voltage potential and the ground voltage potential.

6. An integrated circuit, according to claim 4, wherein the at least one power down transistor further comprises a n-type metal-oxide semiconductor field effect transistor (nMOSFET).

7. An integrated circuit, according to claim 1, wherein the node protection circuit further comprises:
    at least one voltage protection transistor.

8. An integrated circuit, according to claim 4, wherein the at least one voltage protection transistor further comprises:
    a p-type metal-oxide semiconductor field effect transistor (pMOSFET).

9. An integrated circuit, according to claim 1, wherein the digital circuit and the analog circuit further comprise:
    a single thin-gate oxide thickness.

10. An integrated circuit, according to claim 1, wherein the high voltage potential has about twice the voltage potential of the low voltage potential.

11. An apparatus in an integrated circuit for powering down an analog circuit coupled to receive a high voltage potential and a ground voltage potential, comprising:
    a power down circuit electrically coupled to the analog circuit and adapted to power down the analog circuit in response to a power down signal, wherein no portion of the power down circuit is disposed intermediate a high voltage power supply adapted to provide the high voltage potential and the analog circuit; and
    a node protection circuit electrically coupled to the analog circuit, wherein each transistor in the node protection circuit is adapted to provide a predetermined voltage potential to at least one node in the analog circuit in response to the power down signal, the predetermined voltage potential being between the high voltage potential and the ground voltage potential.

12. An apparatus, according to claim 11, further comprising:
a low voltage power supply adapted to provide the predetermined voltage potential; and
a ground voltage power supply adapted to provide the ground voltage potential.

13. An apparatus, according to claim 11, wherein the power down circuit is adapted to control current flow in at least one current path in the analog circuit between a high voltage potential and a ground voltage potential.

14. An apparatus, according to claim 11, wherein the high voltage potential has about two times the voltage potential of the predetermined voltage potential.

15. A method for powering down an analog circuit in an integrated circuit, the analog circuit coupled to receive a high voltage potential and a ground voltage potential, comprising:
receiving a power down signal representing a command to power down the analog circuit;
powering down the analog circuit, using a power down circuit electrically coupled to the analog circuit, in response to the power down signal, wherein no portion of the power down circuit is disposed intermediate a high voltage power supply adapted to provide the high voltage potential and the analog circuit; and
providing a predetermined voltage potential from each transistor in a node protection circuit to at least one node in the analog circuit in response to the power down signal, the predetermined voltage potential being between the high voltage potential and the ground voltage potential.

16. A method, according to claim 15, wherein the powering down the analog circuit further comprises:
opening a current path in the analog circuit.

17. A method, according to claim 16, wherein opening the current path further comprises:
removing a ground voltage potential from the analog circuit.

18. A method, according to claim 15, wherein the high voltage potential has about two times the voltage potential of the low voltage potential.

19. An apparatus in an integrated circuit for powering down an analog circuit coupled to receive a high voltage potential and a ground voltage potential, comprising:
means for receiving a power down signal representing a command to power down the analog circuit;
means for powering down the analog circuit, using a power down circuit electrically coupled to the analog circuit, in response to the power down signal, wherein no portion of the power down circuit is disposed intermediate a high voltage power supply adapted to provide the high voltage potential and the analog circuit; and
means for providing a predetermined voltage potential from each transistor in a node protection circuit to at least one node in the analog circuit in response to the power down signal, the predetermined voltage potential being lower than the high voltage potential and higher than the ground voltage potential.

* * * * *